US006747861B2

(12) United States Patent
Ker et al.

(10) Patent No.: US 6,747,861 B2
(45) Date of Patent: Jun. 8, 2004

(54) ELECTROSTATIC DISCHARGE PROTECTION FOR A MIXED-VOLTAGE DEVICE USING A STACKED-TRANSISTOR-TRIGGERED SILICON CONTROLLED RECTIFIER

(75) Inventors: Ming-Dou Ker, Hsinghuang (TW); Chien-Hui Chung, Taipei (TW); Hsin-Chin Jiang, Taipei (TW)

(73) Assignee: Industrial Technology Research Institute (TW)

( * ) Notice: Subject to any disclaimer, the term of this patent is extended or adjusted under 35 U.S.C. 154(b) by 204 days.

(21) Appl. No.: 09/987,616

(22) Filed: Nov. 15, 2001

(65) Prior Publication Data

US 2003/0090845 A1 May 15, 2003

(51) Int. Cl.[7] ................................. H02H 9/04
(52) U.S. Cl. ........................... 361/111; 361/91
(58) Field of Search ..................... 361/56, 91, 111, 361/58; 257/355–363

(56) References Cited

U.S. PATENT DOCUMENTS

| 5,400,202 A | * | 3/1995 | Metz et al. ................. 361/56 |
| 5,453,384 A | | 9/1995 | Chatterjee ..................... 437/6 |
| 5,502,328 A | | 3/1996 | Chen et al. ................. 257/546 |
| 5,581,104 A | | 12/1996 | Lowrey et al. ............. 257/355 |
| 5,629,544 A | | 5/1997 | Voldman et al. ........... 257/355 |
| 5,654,862 A | | 8/1997 | Worley et al. ............. 361/111 |
| 5,719,737 A | | 2/1998 | Maloney ..................... 361/111 |
| 5,807,791 A | | 9/1998 | Bertin et al. ............... 438/738 |
| 5,907,462 A | | 5/1999 | Chatterjee et al. .......... 361/56 |
| 5,932,918 A | | 8/1999 | Krakauer .................... 257/368 |
| 5,940,258 A | | 8/1999 | Duvvury ...................... 361/56 |
| 5,986,307 A | * | 11/1999 | Yu .............................. 257/360 |
| 5,990,520 A | | 11/1999 | Noorlag et al. ............ 257/362 |
| 6,015,992 A | | 1/2000 | Chatterjee et al. ......... 257/350 |
| 6,034,397 A | | 3/2000 | Voldman ..................... 257/335 |
| 6,433,979 B1 | * | 8/2002 | Yu .............................. 361/56 |

OTHER PUBLICATIONS

S. Voldman et al., "Semiconductor Process and Structural Optimization of Shallow Trench Isolation–Defined and Polysilicon–Bound Source/Drain Diodes for ESD Networks", EOS/ESD Symposium Proceedings, 1998, pp. 98–151 through 98–160.

Steven H. Voldman et al., "Analysis of Snubber–Clamped Diode–String Mixed Voltage Interface ESD Protection Network for Advanced Microprocessors", EOS/ESD Symposium Proceedings 1995, pp. 95–43 through 95–61.

(List continued on next page.)

Primary Examiner—Stephen W. Jackson
Assistant Examiner—Boris Benenson
(74) Attorney, Agent, or Firm—Finnegan, Henderson, Farabow, Garrett & Dunner, L.L.P.

(57) ABSTRACT

An electrostatic discharge protection circuit that includes a rectifier, having an anode and a cathode, including a first p-type portion, a first n-type portion contiguous with the first p-type portion, a second p-type portion contiguous with the first n-type portion, and a second n-type portion contiguous with the second p-type portion, wherein the first p-type portion is coupled to the anode and the second n-type portion is coupled to the cathode, a first transistor having a first terminal, a second terminal and a gate terminal, wherein the first terminal is coupled to the first n-type portion of the rectifier, a second transistor having a first terminal, a second terminal and a gate terminal, wherein the first terminal is coupled to the second terminal of the first transistor, and the second terminal is coupled to the second n-type portion of the rectifier, and a voltage coupling circuit having a first terminal, a second terminal, a third terminal, and a fourth terminal, wherein the first terminal is coupled to the anode of the rectifier, the second and the third terminals are respectively coupled to the gate terminals of the first and second transistors, and the fourth terminal is coupled to the cathode.

50 Claims, 7 Drawing Sheets

OTHER PUBLICATIONS

Marcel J. M. Pelgrom et al., "A 3/5 V Compatible I/O Buffer", IEEE Journal of Solid–State Circuits, vol. 30, No. 7, Jul. 1995, pp. 823–825.

Héctor Sánchez et al., "A Versatile 3.3/2.5/1.8–V CMOS I/O Driver Built in a 0.2–$\mu$m, 3.5–nm Tox, 1.8–V CMOS Technology", IEEE Journal of Solid–State Circuits, vol. 34, No. 11, Nov. 1999, pp. 1501–1511.

Gajendra P. Singh et al., "High–Voltage–Tolerant I/O Buffers With Low–Voltage CMOS Process", IEEE Journal of Solid–State Circuits, vol. 34, No. 11, Nov. 1999, pp. 1512–1525.

C. Richier et al., "Investigation on Different ESD Protection Strategies Devoted to 3.3 V RF Applications (2 Ghz) in a 0.18 um CMOS Process", EOS/ESD Symposium Proceedings 2000, pp. 00–251 through 00–259.

Nishath K. Verghese et al., "Verification of RF and Mixed–Signal Integrated Circuits for Substrate Coupling Effects", IEEE 1997 Custom Integrated Circuits Conference, 1997, pp. 363–370.

Ranjit Gharpurey, "A Methodology for Measurement and Characterization of Substrate Noise in High Frequency Circuits", IEEE 1998 Custom Integrated Circuits Conference, 1998, pp. 487–490.

Min Xu et al., Measuring and Modeling the Effects of Substrate Noise on the LNA for a CMOS GPS Receiver, IEEE Journal of Solid–State Circuits, vol. 36, No. 3, Mar. 2001, pp. 473–485.

Ming–Dou Ker et al., "ESD Protection Design on Analog Pin With Very Low Input Capacitance for High–Frequency or Current–Mode Applications", IEEE Journal of Solid–State Circuits, vol. 35, No. 8, Aug. 2000, pp. 1194–1199.

Makoto Nagata et al., "Physical Design Guides for Substrate Noise Reduction in CMOS Digital Circuits", IEEE Journal of Solid–State Circuits, vol. 36, No. 3, Mar. 2001, pp. 539–549.

Ming–Dou Ker et al., "ESD Protection Design on Analog Pin With Very Low Input Capacitance for RF or Current–Mode Applications", Twelfth Annual IEEE International ASIC/SOC Conference, 1999, pp. 352–356.

Ming–Dou Ker, "Whole–Chip ESD Protection Design With Efficient VDD–to–VSS ESD Clamp Circuits for Submicron CMOS VLSI", IEEE Transactions on Electron Devices, vol. 46, No. 1, Jan. 1999, pp. 173–183.

Tung–Yang Chen et al., "Design on ESD Protection Circuit with Very Low and Constant Input Capacitance", Proceedings of the IEEE ISQED 2001, pp. 247–248.

Ming–Dou Ker et al., "A Gate–Coupled PTLSCR/NTLSCR ESD Protection Circuit for Deep–Submicron Low–Voltage CMOS IC's", IEEE of Solid–State Circuits, 1997, vol., 32, pp. 38–51.

Ming–Dou Ker et al., "On–Chip ESD Protection Using Capacitor–Couple Technique in 0.5–$\mu$m 3–V CMOS Technology", Proc. 8th Int'l. ASIC Conf., Exhibit, 1995, pp. 135–138.

W.R. Anderson, et al., "ESD Protection for Mixed–Voltage I/O Using NMOS Transistors Stacked in a Cascode Configuration", Electrical Overstress/Electrostatic Discharge Symposium Proceedings, 1998, pp. 98–54 through 98–62.

Ming–Dou Ker et al, "CMOS On–Chip ESD Protection Design With Substrate–Triggering Technique", IEEE International Conference on Electronics, Circuits and Systems, 1998, vol. 1, pp. 273–276.

* cited by examiner

ELECTROSTATIC DISCHARGE PROTECTION FOR A MIXED-VOLTAGE DEVICE USING A STACKED-TRANSISTOR-TRIGGERED SILICON CONTROLLED RECTIFIER

DESCRIPTION OF THE INVENTION

1. Field of the Invention

This invention pertains in general to a semiconductor device, and, more particularly, to an electrostatic discharge protection circuit using a stacked-transistor-triggered rectifier device.

2. Background of the Invention

A semiconductor integrated circuit (IC) is generally susceptible to an electrostatic discharge (ESD) event that may damage or destroy the IC. An ESD event refers to a phenomenon of electrical discharge of a current (positive or negative) for a short duration in which a large amount of current is discharged through the IC. Protecting an IC from an ESD event, therefore, is an important factor to be considered in IC design. In deep sub-micron, or small geometry, complementary metal oxide silicon (CMOS) technology, the protection of an IC becomes an even more important issue due to the implementation of thin oxide layers in such ICs. As oxide layers become thinner, the voltage margin between oxide breakdown voltage and drain snapback breakdown voltage of a metal-oxide-silicon ("MOS") transistor is reduced.

It also follows that transistors having a smaller geometry operate in different voltage levels than transistors with a larger geometry, and the transistors with a smaller geometry cannot withstand an ESD level tolerable to transistors with a larger geometry. As designers continue to design ICs with increasingly smaller geometries, it is inevitable that ICs having transistors with different geometries will be interconnected for a variety of applications. Therefore, with a mix of different operating voltage levels, input/output (I/O) pads of mixed voltage ICs must be designed to avoid electrical overstress and prevent undesirable current leakage paths. An ESD protection circuit must also satisfy the same I/O interface conditions and constraints, and be able to be triggered so as to prevent the internal circuitry from being damaged. Many schemes have been implemented to protect a mixed voltage IC from an ESD event.

FIG. 1 is a reproduction of FIG. 2 of U.S. Pat. No. 5,932,918 to Krakauer. Krakauer describes an ESD protection circuit for mixed voltage I/O circuits. FIG. 1 shows an ESD protection device using two n-type MOS (NMOS) transistors stacked in a cascade configuration at the I/O buffer to protect a mixed voltage IC. The two stacked-NMOS transistors have common nodes formed by a shared diffusion. However, due to the reduced gate oxide breakdown voltage in a mixed I/O application, the MOS gate oxide of the I/O buffer might be damaged under an ESD event before the lateral NPN bipolar transistor in the stacked NMOS transistors can be turned on to divert the ESD current away from the internal circuits.

It is accordingly a primary object of the invention to provide an electrostatic discharge protection circuit using a stacked-transistor-triggered silicon controlled rectifier device that substantially obviates one or more of the problems due to limitations and disadvantages of the related art.

SUMMARY OF THE INVENTION

In accordance with the invention, there is provided an electrostatic discharge protection circuit that includes a rectifier, having an anode and a cathode, including a first p-type portion, a first n-type portion contiguous with the first p-type portion, a second p-type portion contiguous with the first n-type portion, and a second n-type portion contiguous with the second p-type portion, wherein the first p-type portion is coupled to the anode and the second n-type portion is coupled to the cathode, a first transistor having a first terminal, a second terminal and a gate terminal, wherein the first terminal is coupled to the first n-type portion of the rectifier, a second transistor having a first terminal, a second terminal and a gate terminal, wherein the first terminal is coupled to the second terminal of the first transistor, and the second terminal is coupled to the second n-type portion of the rectifier, and a voltage coupling circuit having a first terminal, a second terminal, a third terminal, and a fourth terminal, wherein the first terminal is coupled to the anode of the rectifier, the second and the third terminals are respectively coupled to the gate terminals of the first and second transistors, and the fourth terminal is coupled to the cathode.

In one aspect, the voltage coupling circuit provides a first voltage signal to the gate of the first transistor and a second voltage signal to the gate of the second transistor to turn on the rectifier.

In another aspect, the voltage coupling circuit includes a first capacitor coupled to the first terminal of the voltage coupling circuit and the gate terminal of the first transistor, and a second capacitor coupled to the first terminal of the voltage coupling circuit and the gate terminal of the second transistor.

In yet another aspect, the voltage coupling circuit further includes a clamping circuit, a first resistor and a second resistor, the clamping circuit coupled to the first resistor and the gate terminal of the first transistor, and the first resistor coupled to the clamping circuit and the cathode of the rectifier, and the second resistor coupled to the gate terminal of the second transistor and the cathode of the rectifier.

In still another aspect, the clamping circuit clamps the first voltage signal provided to the gate terminal of the first transistor, and the first and second resistors, in conjunction with the first and second capacitors, control a time delay to turn on the rectifier.

Also in accordance with the present invention, there is provided an integrated circuit that includes a signal pad for receiving and outputting a signal, a rectifier with an anode and a cathode including a first p-type portion, a first n-type portion contiguous with the first p-type portion, a second p-type portion contiguous with the first n-type portion, and a second n-type portion contiguous with the second p-type portion, wherein the anode of the rectifier is coupled to the signal pad, a first transistor having a first terminal, a second terminal and a gate terminal, wherein the first terminal is coupled to the first n-type portion of the rectifier, and a second transistor having a first terminal, a second terminal and a gate terminal, wherein the first terminal is coupled to the second n-type portion of the rectifier, and the second terminal is coupled to the second terminal of the first transistor.

In one aspect, the circuit further comprises an output buffer having a first terminal and a second terminal, wherein the first terminal is coupled to the signal pad and the second terminal is coupled to the first capacitor and the second capacitor.

Additionally in accordance with the present invention, there is provided an integrated circuit that includes an output buffer having a first terminal and a second terminal, a rectifier with an anode and a cathode including a first p-type portion, a first n-type portion contiguous with the first p-type portion, a second p-type portion contiguous with the first n-type portion, and a second n-type portion contiguous with the second p-type portion, wherein the anode of the rectifier is coupled to the first terminal of the output buffer, a first transistor having a first terminal, a second terminal and a gate terminal, wherein the first terminal is coupled to the first n-type portion of the rectifier, and a second transistor having a first terminal, a second terminal and a gate terminal, wherein the first terminal is coupled to the second-type portion of the rectifier, and the second terminal is coupled to the second terminal of the first transistor.

Also in accordance with the present invention, there is provided an integrated circuit that includes a signal pad for receiving and outputting a signal, an output buffer having a first terminal and a second terminal, wherein the second terminal is coupled to the signal pad, a rectifier, having an anode and a cathode, including a first p-type portion, a first n-type portion contiguous with the first p-type portion, a second p-type portion contiguous with the first n-type portion, and a second n-type portion contiguous with the second p-type portion, wherein the first p-type portion is coupled to the anode, the second n-type portion is coupled to the cathode, the anode is coupled to the first terminal of the output buffer, and the cathode is coupled to ground, a first transistor having a first terminal, a second terminal and a gate terminal, wherein the first terminal is coupled to the first n-type portion of the rectifier, a second transistor having a first terminal, a second terminal and a gate terminal, wherein the first terminal is coupled to the second terminal of the first transistor, and the second terminal is coupled to the second n-type portion of the rectifier, and a voltage coupling circuit having a first terminal, a second terminal, a third terminal and a fourth terminal, wherein the first terminal is coupled to the anode of the rectifier, the second and the third terminals are respectively coupled to the gate terminals of the first and second transistor, and the fourth terminal is coupled to the cathode of the rectifier.

Additionally in accordance with the present invention, there is provided an integrated circuit that includes a signal pad for receiving and outputting a signal, an output buffer having a first terminal and a second terminal, wherein the second terminal is coupled to the signal pad, a rectifier with an anode and a cathode including a first p-type portion, a first n-type portion contiguous with the first p-type portion, a second p-type portion contiguous with the first n-type portion, and a second n-type portion contiguous with the second p-type portion, wherein the anode of the rectifier is coupled to the second terminal of the output buffer and the cathode of the rectifier is coupled to ground, a first transistor having a first terminal, a second terminal and a gate terminal, wherein the first terminal is coupled to the first n-type portion of the rectifier, a second transistor having a first terminal, a second terminal and a gate terminal, wherein the first terminal is coupled to the second terminal of the first transistor, and the second terminal is coupled to the second n-type portion of the rectifier; and a voltage coupling circuit having a first terminal, a second terminal, a third terminal and a fourth terminal, wherein the first terminal is coupled to the first terminal of the output buffer, the second and the third terminals are respectively coupled to the gate terminals of the first and second transistor, and the fourth terminal is coupled to the cathode of the rectifier.

Further in accordance with the present invention, there is provided a method for protecting an integrated circuit with a dual input/output pad from electrostatic discharge that includes providing a rectifier having a first p-type portion, a first n-type portion contiguous with the first p-type portion, a second p-type portion contiguous with the first n-type portion, and a second n-type portion contiguous with the second p-type portion, providing a first transistor having a first terminal, a second terminal and a gate terminal, wherein the first terminal is coupled to the first n-type portion of the rectifier, and providing a second transistor having a first terminal, a second terminal and a gate terminal, wherein the first terminal is coupled to the second n-type portion of the rectifier, and the second terminal is coupled to the second terminal of the first transistor.

In one aspect, the method further includes a step of providing a first voltage signal to the gate of the first transistor and a second voltage signal to the gate of the second transistor to turn on the rectifier.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present exemplary embodiments of the invention, examples of which are illustrated in the accompanying drawings. Wherever possible, the same reference numbers will be used throughout the drawings to refer to the same or like parts.

In accordance with the present invention, there is provided a stacked-NMOS transistor-triggered silicon controlled rectifier ESD protection circuit. ESD protection is achieved with a gate-coupling technique in a stacked-NMOS transistor-triggered silicon controlled rectifier ("SNTSCR") ESD protection device implemented in an I/O buffer. The ESD protection device of the present invention has a low trigger voltage to protect thin oxide layers in mixed-voltage sub-micron CMOS ICs. The SNTSCR of the present invention ensures the reliability and safety of an I/O buffer in a mixed voltage environment, and provides higher ESD robustness with a smaller layout area.

Figure 1:
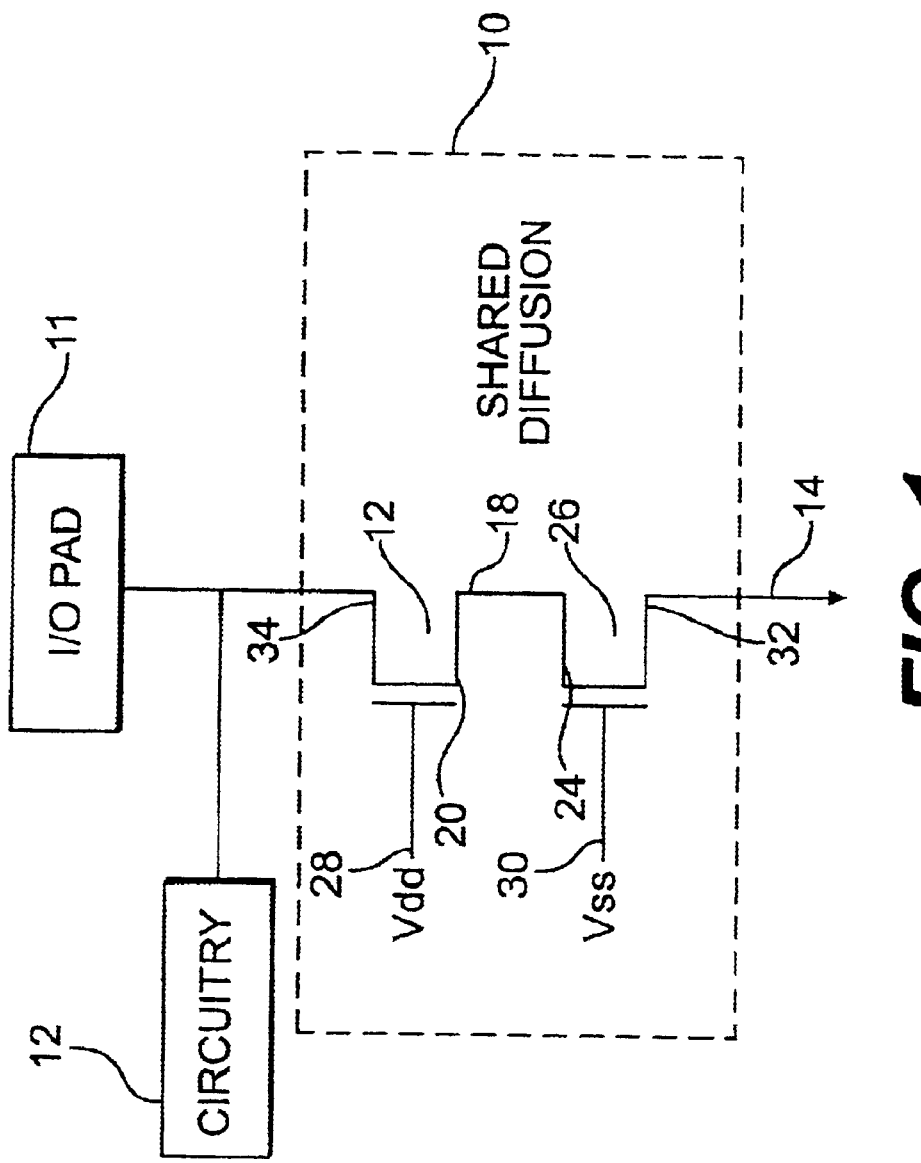
FIG. 1 is a circuit diagram of a known ESD protection circuit.
Figure 2:
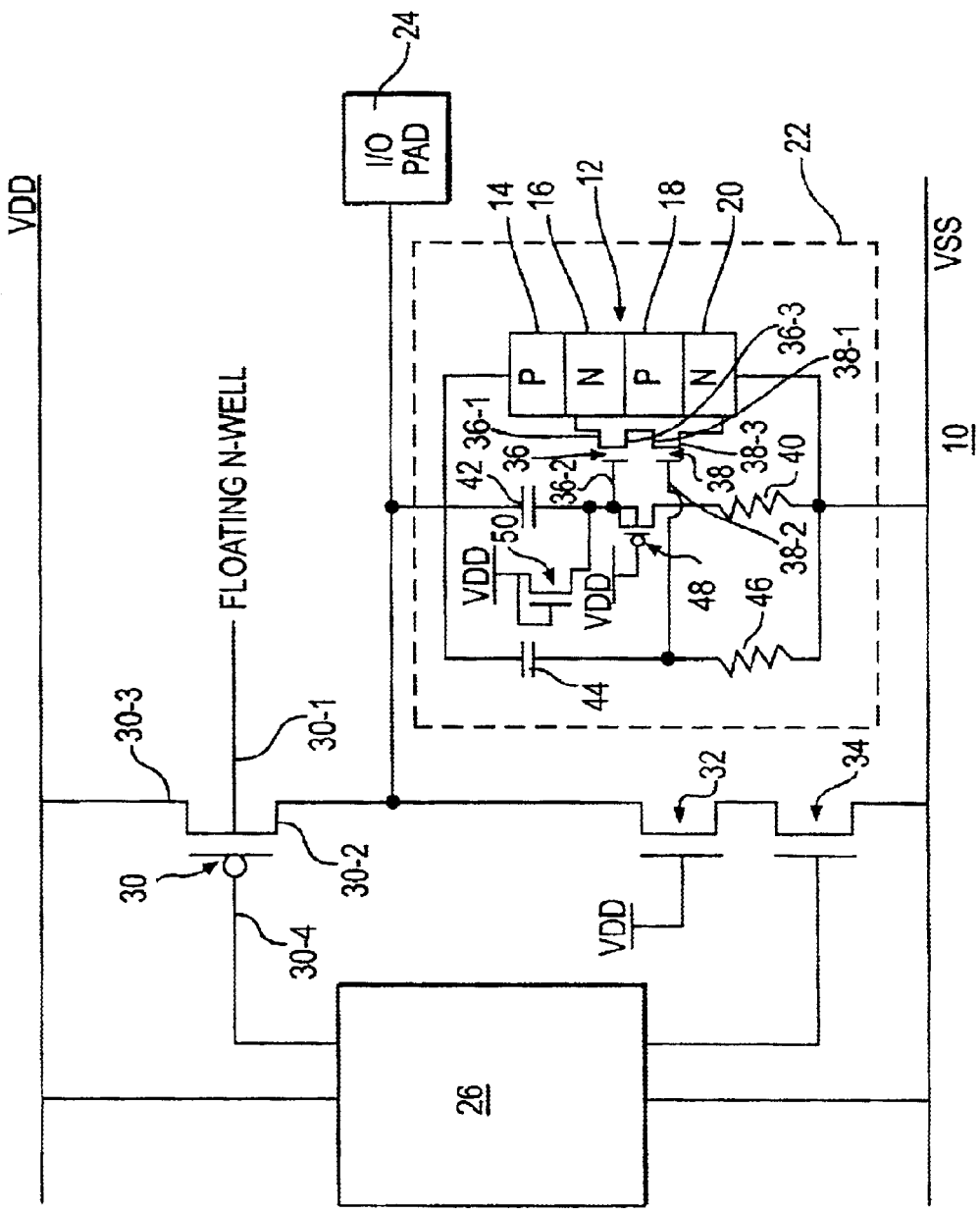
FIG. 2 is a circuit diagram in accordance with one embodiment of the present invention.

FIG. 2 is a circuit diagram of one embodiment of the present invention. Referring to FIG. 2, an integrated circuit ("IC") 10 includes an I/O pad 24, I/O buffer 28, ESD clamp circuit 22, and an internal circuit 26. I/O buffer 28 includes a transistor 30 and stacked transistors 32 and 34, in which the source terminal (not numbered) of transistor 32 is coupled to the drain terminal (not numbered) of transistor 34. The gate terminal of transistor 32 is coupled to a voltage source VDD. The gate terminal of transistor 34 is coupled to internal circuit 26, and the source terminal is coupled to VSS, or ground. In one embodiment, transistor 30 is a PMOS transistor with a floating n-well, and transistors 32 and 34 are NMOS transistors. Transistor 30 has a source terminal 30-3, gate terminal 30-4, drain terminal 30-2, and n-well terminal 30-1. Source terminal 30-3 is coupled to voltage source VDD, gate terminal 30-4 is coupled to internal circuit 26, and drain terminal 30-2 is coupled to I/O pad 24 and the drain of transistor 32.

ESD clamp circuit 22 includes a parasitic silicon controlled rectifier ("SCR") 12, stacked transistors 36 and 38, a voltage coupling circuit (not numbered). SCR 12 includes a first p-type portion 14, a first n-type portion 16 contiguous with first p-type portion 14, a second p-type portion 18 contiguous with first n-type portion 16, and a second n-type portion 20 contiguous with second p-type portion 18. First p-type portion 14 is coupled to an anode terminal (not shown) and second n-type portion 20 is coupled to a cathode terminal (not shown). In addition, the cathode terminal of SCR 12 is coupled to VSS, or ground, and the anode terminal is coupled to I/O pad 24.

Transistor 36 include a drain terminal 36-1, gate terminal 36-2, and source terminal 36-3. Transistor 38 includes a drain terminal 38-1, gate terminal 38-2, and source terminal 38-3. In one embodiment, transistors 36 and 38 are NMOS transistors. Source terminal 36-3 of transistor 36 is coupled to drain terminal 38-1 of transistor 38, and drain terminal 36-1 of transistor 36 is coupled to first n-type portion 16 of SCR 12. Source terminal 38-3 is coupled to second n-type portion 20 of SCR 12. Gate terminals 36-2 and 38-2 are coupled to the voltage coupling circuit.

The voltage coupling circuit includes a first capacitor 42, a second capacitor 44, a transistor 50, a resistor network (not numbered), and a clamping circuit (not numbered). First capacitor 42 is coupled to gate terminal 36-2 of transistor 36, and second capacitor 44 is coupled to gate terminal 38-2 of transistor 38. First capacitor 42 and second capacitor 44 are also coupled in parallel to I/O pad 24. Transistor 50 is a diode-connected NMOS transistor. The drain terminal (not numbered) of transistor 50 is coupled to a voltage source, VDD, and the gate (not numbered) of transistor 50. The source of transistor 50 is coupled to gate terminal 36-2 of transistor 36 and first capacitor 42.

The resistor network includes a first resistor 46 and a second resistor 40. First resistor 46 is coupled to second capacitor 44 and gate terminal 38-2 of transistor 38. Each of first resistor 46 and second resistor 40 is coupled to VSS. The clamping circuit of the ESD clamp circuit 22 includes a transistor 48. In one embodiment, transistor 48 is a PMOS transistor. The gate (not numbered) of transistor 48 is coupled to voltage source VDD, and the source (not numbered) of transistor 48 is coupled to gate terminal 36-2 of transistor 36 and the source of transistor 50. The drain (not numbered) of transistor 48 is coupled to resistor 40.

Figure 3:
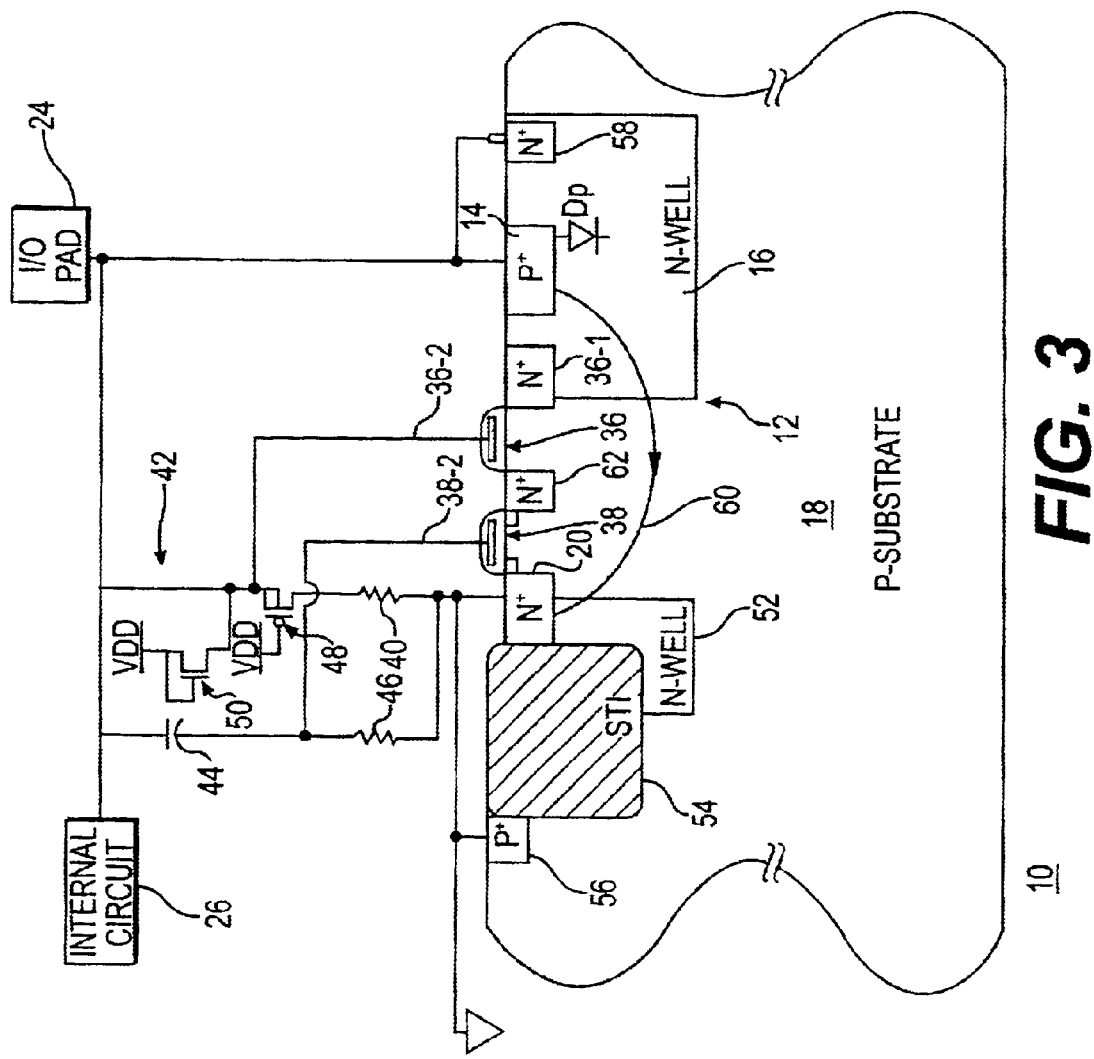
FIG. 3 is a circuit diagram in accordance with the embodiment shown in FIG. 2 with the SNTSCR device shown in a cross-sectional view.

FIG. 3 shows a circuit diagram in accordance with the embodiment shown in FIG. 2 with SCR device 12 shown in a cross-sectional view. Referring to FIG. 3, second p-type portion 18 of SCR 12 comprises a p-type semiconductor substrate 18. First n-type portion 16 comprises an n-well 16 formed inside substrate 18. First p-type portion 14 comprises a p-type diffused region 14 formed inside N-well 16. Second n-type portion 20 comprises an n-type diffused region 20 formed inside substrate 18 and an n-well 52, and is spaced apart from first n-type portion 16. A path 60 indicates the path of an ESD current in SCR 12 when SCR 12 is triggered by an ESD event.

Substrate 18 also includes a p-type diffused region 56, and a shallow trench isolation ("STI") 54 contiguous with p-type diffused region 56, n-well 52 and n-type diffused region 20. Each of p-type diffused region 56 and n-type diffused region 20 is coupled to ground. In addition, stacked transistors 36 and 38 are formed on substrate 18. Transistor 36 includes a gate 36-2, drain 36-1 and source 62. Transistor 38 includes a gate 38-2, drain 62, and source 20. Therefore, drain 36-1 of transistor 36 comprises diffused n-type region 36-1 formed contiguous with n-well 16 and inside substrate 18. Source 36-3 of transistor 36 and drain 38-1 of transistor 38 share the same diffused n-type region 62 formed inside substrate 18.

Referring to FIG. 2, in operation, ESD clamp circuit 22 should remain in a non-conductive state so that it does not interfere with the voltages levels on I/O pad 24 during normal operations. The voltage on gate terminal 36-2 of transistor 36 is biased at VDD-Vthn through the diode-connected NMOS transistor 50, wherein Vthn is the threshold voltage of transistor 50. Gate terminal 38-2 of transistor 38 is coupled to ground. Under these conditions, diffused n-type region 62, shared by stacked transistors 36 and 38, floats to a voltage of approximately one threshold voltage below VDD. Therefore, the ESD clamp circuit 22 is able to meet the limited stress constraints of a gate oxide during normal operating conditions.

Referring again to FIG. 2, I/O pad 24 may either receive or output a signal. As an input pad, I/O pad 24 receives a logic "0" signal and a logic "1" signal. I/O pad 24 then couples the signal to I/O buffer 28. As the voltage on I/O pad 24 transfers from a logic "0" to a logic "1," capacitor 44 functions to couple a voltage below the threshold voltage to gate terminal 38-2 of transistor 38 to keep transistor 38 in the "off" state, thereby keeping SCR 12 in the "off" state. ESD Clamp circuit 22, which comprises transistor 48, will then turn on to discharge any excessive charge after the gate voltage of transistor 36 increases to VDD+Vthp, wherein Vthp is the threshold voltage of transistor 48. Therefore, clamping circuit 22 clamps the voltage of gate terminal 36-2 to ensure the reliability of the gate oxide under normal operating conditions.

When a positive-to-VSS ESD signal is provided to I/O pad 24, the voltage coupling circuit provides a first voltage signal to transistor 36 and a second voltage signal to transistor 38 to turn on SCR 12 to divert the ESD signal away from internal circuit 26. The resistor network is provided to control a time delay in the triggering of SCR 12.

Figure 5:
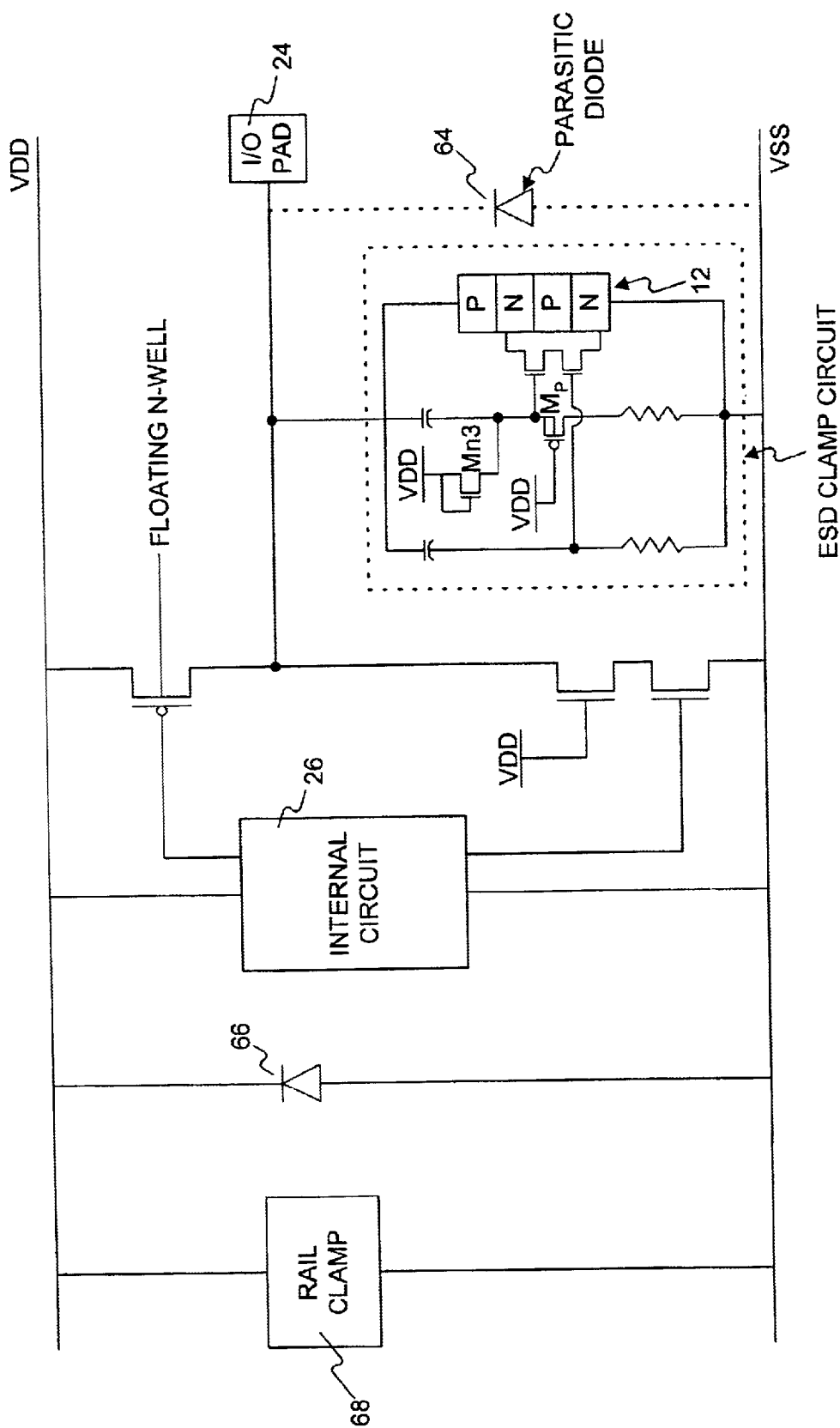
FIG. 5 is an alternate representation of the embodiment shown in FIG. 2.

FIG. 5 is an alternate representation of the embodiment shown in FIG. 2 and is used to illustrate the ESD current path under four modes of ESD-stresses. In an ESD event with a large positive input voltage with respect to VSS, ESD clamp circuit 22 works to shunt the ESD current to ground. In an ESD event with a large positive input voltage with respect to VDD, a parasitic diode 66, formed by p-type substrate 18 and n-well 16 (shown in FIG. 3), turns on. The ESD current flows through the SCR 12 and parasitic diode 66 to VDD. In an ESD event with a large negative input voltage with respect to VSS, a parasitic diode 64, formed by p-type substrate 18 and diffused n-type region 20 (shown in FIG. 3), turns on to bypass the ESD current. In an ESD event with a large negative input voltage with respect to VDD, the ESD current flows through a rail clamp circuit 68 and parasitic diode 64 to shunt the ESD current.

Figure 4:
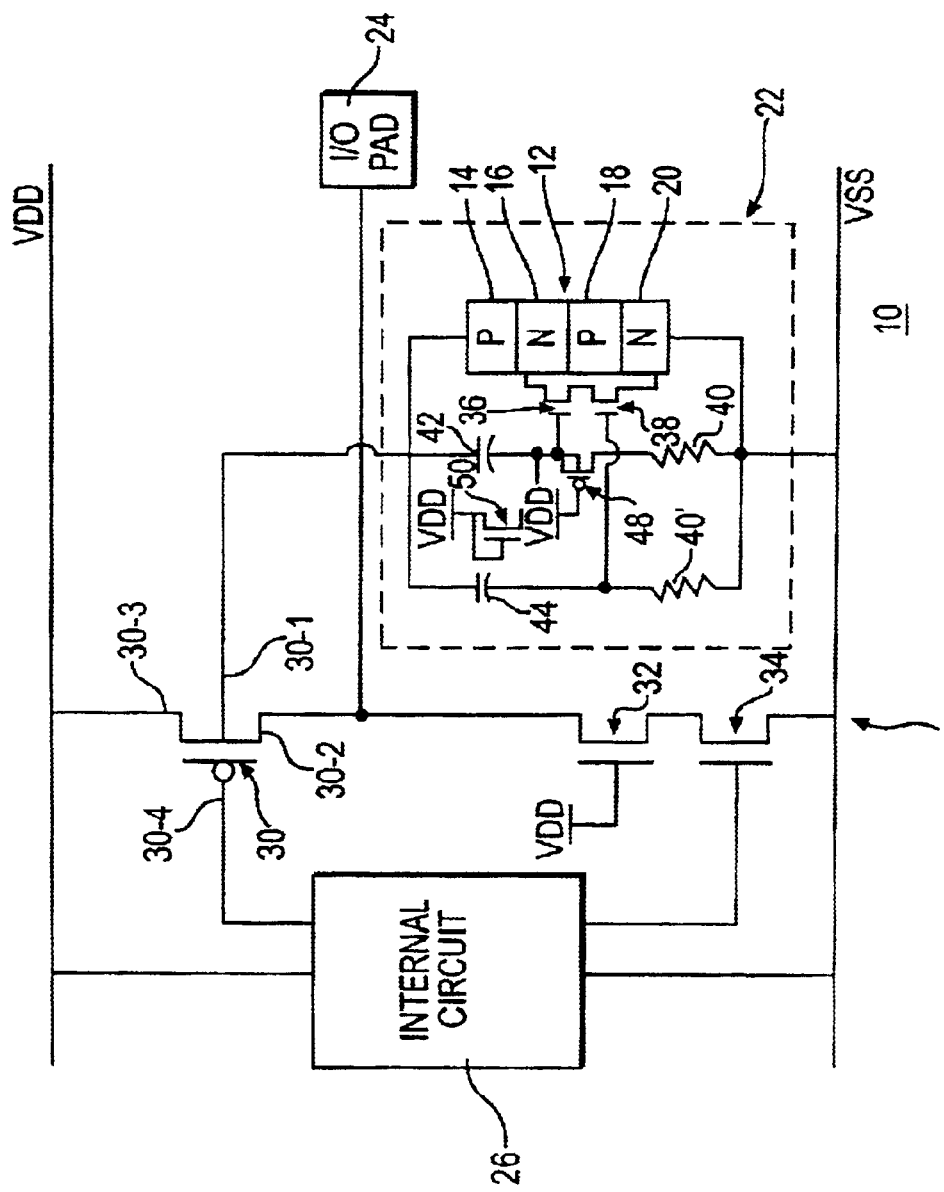
FIG. 4 is a circuit diagram in accordance with another embodiment of the present invention.

FIG. 4 shows a circuit diagram in accordance with another embodiment of the present invention. Referring to FIG. 4, an integrated circuit 10 includes an I/O pad 24, I/O buffer 28, ESD clamp circuit 22, and an internal circuit 26. I/O buffer 28 includes a transistor 30 and stacked transistors 32 and 34, in which the source terminal (not numbered) of transistor 32 is coupled to the drain terminal (not numbered) of transistor 34. The gate terminal of transistor 32 is coupled to a voltage source VDD. The gate terminal of transistor 34 is coupled to internal circuit 26, and the source terminal is coupled to VSS, or ground. In one embodiment, transistor 30 is a PMOS transistor, and transistors 32 and 34 are NMOS transistors. Transistor 30 has a source terminal 30-3, gate terminal 30-4, drain terminal 30-2, and an n-well 30-1. Source terminal 30-3 is coupled to voltage source VDD, gate terminal 30-4 is coupled to internal circuit 26, and drain terminal 30-2 is coupled to I/O pad 24 and the drain of transistor 32.

ESD clamp circuit 22 includes a (SCR) 12, two stacked transistors 36 and 38, a voltage coupling circuit (not numbered). SCR 12 includes a first p-type portion 14, a first n-type portion 16 contiguous with first p-type portion 14, a second p-type portion 18 contiguous with first n-type portion 16, and a second n-type portion 20 contiguous with second p-type portion 18. First p-type portion 14 is coupled to an anode terminal (not shown) and second n-type portion 20 is coupled to a cathode terminal (not shown). In addition, the cathode terminal of SCR 12 is coupled to VSS and the anode terminal is coupled to n-well 30-1 of transistor 30. In other words, I/O buffer 28 includes a first terminal (not numbered) coupled to I/O pad 24 and a second terminal 30-1 coupled to ESD clamp circuit 22.

Transistor 36 include a drain terminal 36-1, gate terminal 38-2, and source terminal 38-3. Transistor 38 includes a drain terminal 38-1, gate terminal 36-2, and source terminal 36-3. In one embodiment, transistors 36 and 38 are NMOS transistors. Source terminal 36-3 of transistor 36 is coupled to drain terminal 38-1 of transistor 38, and drain terminal 36-1 of transistor 36 is coupled to first n-type portion 16 of SCR 12. Source terminal 38-3 is coupled to second n-type portion 20 of SCR 12. Gate terminals 36-2 and 38-2 are coupled to the voltage coupling circuit.

The voltage coupling circuit includes a first capacitor 42, a second capacitor 44, a transistor 50, a resistor network (not numbered), and a clamping circuit (not numbered). First capacitor 42 is coupled to gate terminal 36-2 of transistor 36, and second capacitor 44 is coupled to gate terminal 38-2 of transistor 38. First capacitor 42 and second capacitor 44 are also coupled in parallel to n-well 30-1 of transistor 30 and the anode of SCR 12. Transistor 50 is a diode-connected NMOS transistor. The drain terminal (not numbered) of transistor 50 is coupled to a voltage source, VDD, and the gate (not numbered) of transistor 50. The source of transistor 50 is coupled to gate terminal 36-2 of transistor 36 and first capacitor 42.

The resistor network includes a first resistor 46 and a second resistor 40. First resistor 46 is coupled to second capacitor 44 and gate terminal 38-2 of transistor 38. Each of first resistor 46 and second resistor 40 is coupled to VSS. The clamping circuit of the ESD clamp circuit 22 includes a transistor 48. In one embodiment, transistor 48 is a PMOS transistor. The gate (not numbered) of transistor 48 is coupled to voltage source VDD, and the source (not numbered) of transistor 48 is coupled to gate terminal 36-2 of transistor 36 and the source of transistor 50. The drain (not numbered) of transistor 48 is coupled to resistor 40.

The primary difference of FIG. 4 from FIG. 2 is that capacitors 42 and 44, and the anode terminal of SCR 12 are coupled to n-well terminal 30-1 of transistor 30. This embodiment provides a clamping configuration to ensure that no additional input capacitance is seen at I/O pad 24, an important factor in high-frequency applications.

Figure 6:
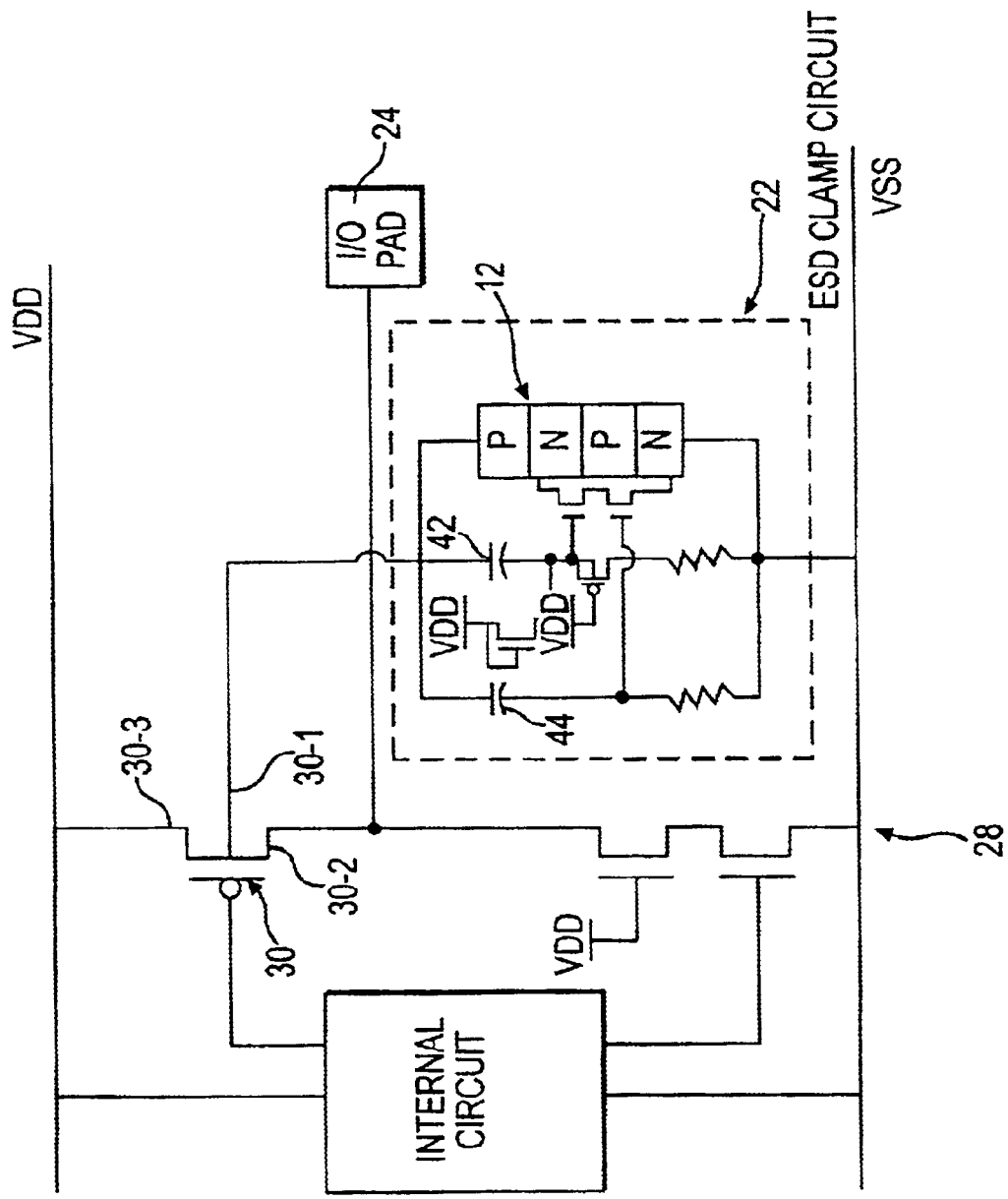
FIG. 6 is a circuit diagram in accordance with another embodiment of the present invention.

FIG. 6 is a circuit diagram in accordance with another embodiment of the present invention. FIGS. 4 and 6 are essentially the same with the difference being the connecting between I/O buffer 28 and ESD clamp circuit 22. Specifically, terminal 30-1, also the n-well of transistor 30, of I/O buffer 28 is coupled to parallel capacitors 42 and 44 of ESD clamp circuit 22. The anode of SCR 12 of ESD clamp circuit 22 is coupled to I/O pad 24 and drain 30-2 of transistor 30. ESD clamp circuit 22 is connected from n-well terminal 30-1 of PMOS transistor 30, wherein the parasitic drain-to-substrate diode between I/O pad 24 and n-well terminal 30-1 essentially exists in PMOS transistor 30. Only noise having a level higher than the voltage level of n-well terminal 30-1 plus a voltage drop across a diode can reach ESD clamp circuit 22.

The present invention also discloses a method to protect an IC in mixed-voltage applications from an ESD event. The method includes providing a parasitic rectifier having a first p-type portion, a first n-type portion contiguous with the first p-type portion, a second p-type portion contiguous with the first n-type portion, and a second n-type portion contiguous with the second p-type portion and providing a first transistor having a first terminal, a second terminal and a gate terminal. The first terminal of the first transistor is coupled to the first n-type portion of the rectifier. The method also includes providing a second transistor having a first terminal, a second terminal and a gate terminal, wherein the first terminal is coupled to the second n-type portion of the rectifier, and the second terminal is coupled to the second terminal of the first transistor. The method further includes providing a first voltage signal to the gate of the first transistor and a second voltage signal to the gate of the second transistor to turn on the rectifier.

Figure 7:
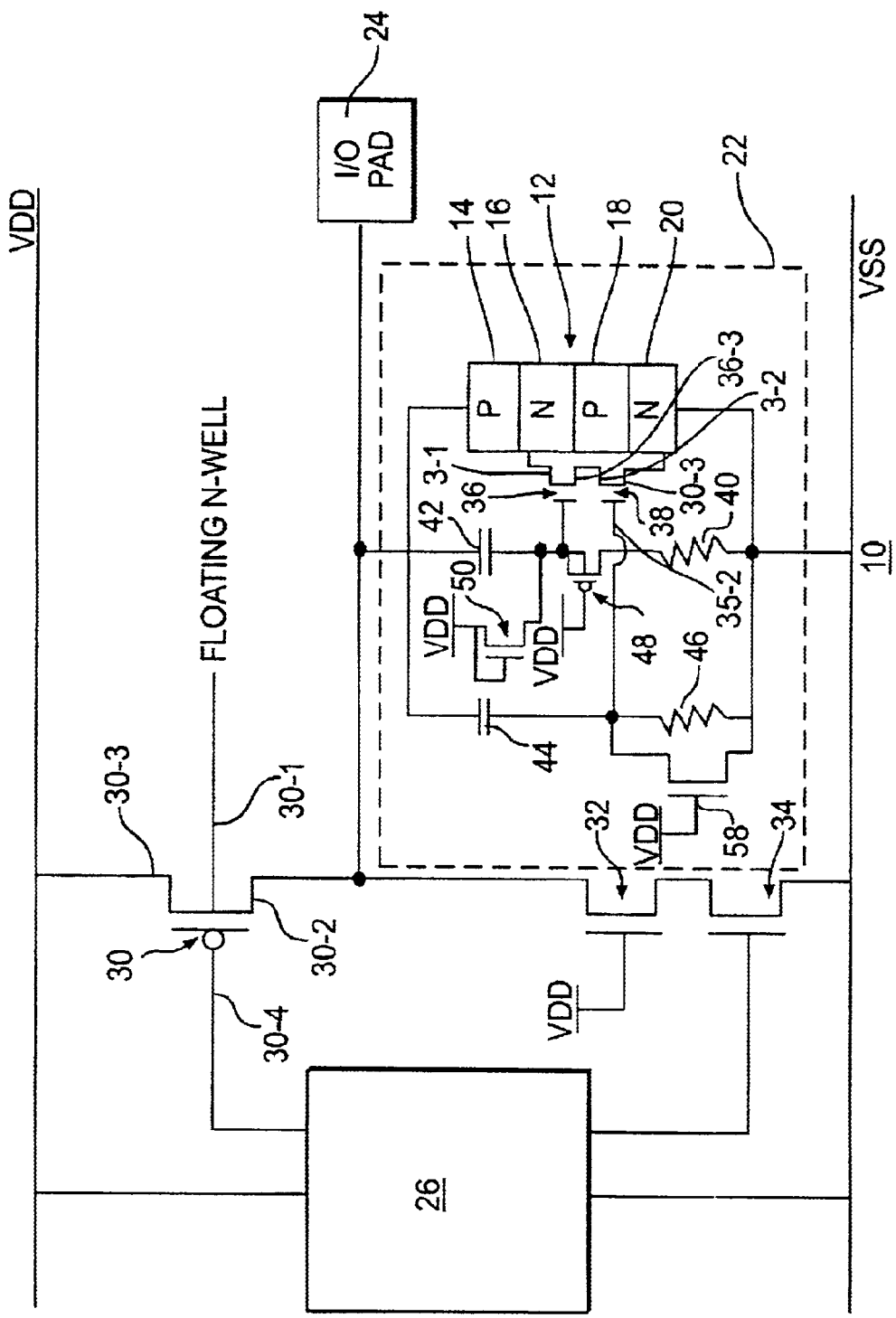
FIG. 7 is a circuit diagram in accordance with another embodiment of the present invention.

FIG. 7 is a circuit diagram in accordance with another embodiment of the present invention. FIGS. 2 and 7 are similar except for a gate coupling circuit that comprises NMOS transistor 58. Referring to FIG. 7, the gate coupling circuit is added in ESD clamp circuit 22 to improve the design margin. Transistor 58 is disposed between gate terminal 38-2 of transistor 38 and VSS, and the gate terminal of transistor 58 is coupled to VDD. As a result, under normal operating conditions, transistor 58 is always turned on, thereby reducing the coupling voltage on gate terminal 38-2 of transistor 38 below the threshold voltage of transistor 38 to avoid any unexpected leakage current. During an ESD event, transistor 58 is off once the initial voltage level on the floating VDD power line is grounded, and the coupling voltage on the gate terminal 38-2 is determined by the first resistor 46 and the second capacitor 44.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electrostatic discharge protection circuit, comprising:
   a rectifier, having an anode and a cathode, including a first p-type portion, a first n-type portion contiguous with the first p-type portion, a second p-type portion contiguous with the first n-type portion, and a second n-type portion contiguous with the second p-type portion, wherein the first p-type portion is coupled to the anode and the second n-type portion is coupled to the cathode;
   a first transistor having a first terminal, a second terminal and a gate terminal, wherein the first terminal is coupled to the first n-type portion of the rectifier;
   a second transistor having a first terminal, a second terminal and a gate terminal, wherein the first terminal is coupled to the second terminal of the first transistor, and the second terminal is coupled to the second n-type portion of the rectifier; and
   a voltage coupling circuit having a first terminal, a second terminal, a third terminal, and a fourth terminal, wherein the first terminal is coupled to the anode of the rectifier, the second and the third terminals are respectively coupled to the gate terminals of the first and second transistors, and the fourth terminal is coupled to the cathode.

2. The circuit as claimed in claim 1, wherein the voltage coupling circuit provides a first voltage signal to the gate of the first transistor and a second voltage signal to the gate of the second transistor to turn on the rectifier.

3. The circuit as claimed in claim 2, wherein the voltage coupling circuit includes a first capacitor coupled to the first terminal of the voltage coupling circuit and the gate terminal of the first transistor, and a second capacitor coupled to the first terminal of the voltage coupling circuit and the gate terminal of the second transistor.

4. The circuit as claimed in claim 3, wherein the voltage coupling circuit further includes a third transistor having a source, a drain and a gate, the drain of the third transistor coupled to the gate of the first transistor and the source of the third transistor coupled to the gate of the first transistor.

5. The circuit as claimed in claim 3, wherein the voltage coupling circuit further includes a clamping circuit, a first resistor and a second resistor, the clamping circuit coupled to the first resistor and the gate terminal of the first transistor, and the first resistor coupled to the clamping circuit and the cathode of the rectifier, and the second resistor coupled to the gate terminal of the second transistor and the cathode of the rectifier.

6. The circuit as claimed in claim 5, wherein the clamping circuit clamps the first voltage signal provided to the gate terminal of the first transistor, and the first and second resistors, in conjunction with the first and second capacitors, control a time delay to turn on the rectifier.

7. The circuit as claimed in claim 5, wherein the clamping circuit comprises a transistor.

8. The circuit as claimed in claim 1, wherein the second p-type portion of the rectifier comprises a p-type semiconductor substrate.

9. The circuit as claimed in claim 1, wherein the first n-type portion of the rectifier comprises an n-well in a semiconductor substrate.

10. The circuit as claimed in claim 8, wherein the first n-type portion of the rectifier includes an n-well in the semiconductor substrate, and the first p-type portion of the rectifier includes a p-type diffused region inside the n-well.

11. The circuit as claimed in claim 10, wherein the second n-type portion of the rectifier comprises an n-type diffused region inside the semiconductor substrate and spaced apart from the first n-type portion.

12. The circuit as claimed in claim 5, wherein the voltage coupling circuit further includes a fourth transistor having a source, a drain and a gate, the drain coupled to the gate of the second transistor, the gate coupled to the drain of the third transistor, and the source coupled to the cathode.

13. An integrated circuit, comprising:
   a signal pad for receiving and outputting a signal;
   a rectifier with an anode and a cathode including a first n-type portion, a first n-type portion contiguous with the first p-type portion, a second p-type portion contiguous with the first n-type portion, and a second n-type portion contiguous with the second p-type portion, wherein the anode of the rectifier is coupled to the signal pad;
   a first transistor having a first terminal, a second terminal and a gate terminal, wherein the first terminal is coupled to the first n-type portion of the rectifier;
   a second transistor having a first terminal, a second terminal and a gate terminal, wherein the first terminal is coupled to the second n-type portion of the rectifier, and the second terminal is coupled to the second terminal of the first transistor; and
   a voltage coupling circuit coupled to the gate terminals of the first and second transistors.

14. The circuit as claimed in claim 13, wherein the anode is coupled to the first p-type portion.

15. The circuit as claimed in claim 13, wherein the cathode is coupled to the second n-type portion.

16. The circuit as claimed in claim 13, wherein the voltage coupling circuit provides a first voltage signal to the gate of the first transistor and a second voltage signal to the gate of the second transistor to turn on the rectifier.

17. The circuit as claimed in claim 13, wherein the voltage coupling circuit includes a first capacitor coupled to the gate terminal of the first transistor and a second capacitor coupled to the gate terminal of the second transistor.

18. The circuit as claimed in claim 17, wherein the first capacitor and the second capacitor are coupled to the signal pad.

19. The circuit as claimed in claim 17, further comprising an output buffer having a first terminal and a second terminal, wherein the first terminal is coupled to the signal pad and the second terminal is coupled to the first capacitor and the second capacitor.

20. The circuit as claimed in claim 19, wherein the output buffer comprises a transistor, wherein the second terminal is coupled to an n-well of the transistor.

21. The circuit as claimed in claim 15, wherein the voltage coupling circuit further comprises a clamping circuit to clamp the first voltage signal provided to the gate terminal of the first transistor.

22. The circuit as claimed in claim 13, wherein the second p-type portion of the rectifier comprises a p-type semiconductor substrate.

23. The circuit as claimed in claim 13, wherein the first n-type portion of the rectifier comprises an n-well in a semiconductor substrate.

24. The circuit as claimed in claim 22, wherein the first n-type portion of the rectifier comprises an n-well in the semiconductor substrate, and the first p-type portion comprises a p-type diffused region inside the n-well.

25. An integrated circuit, comprising:
- a signal pad for receiving and outputting a signal;
- an output buffer having a first terminal and a second terminal, wherein the second terminal is coupled to the signal pad;
- a rectifier, having an anode and a cathode, including a first p-type portion, a first n-type portion contiguous with the first p-type portion, a second p-type portion contiguous with the first n-type portion, and a second n-type portion contiguous with the second p-type portion, wherein the first p-type portion is coupled to the anode, the second n-type portion is coupled to the cathode, the anode is coupled to the first terminal of the output buffer, and the cathode is coupled to ground;
- a first transistor having a first terminal, a second terminal and a gate terminal, wherein the first terminal is coupled to the first n-type portion of the rectifier;
- a second transistor having a first terminal, a second terminal and a gate terminal, wherein the first terminal is coupled to the second terminal of the first transistor, and the second terminal is coupled to the second n-type portion of the rectifier; and
- a voltage coupling circuit having a first terminal, a second terminal, a third terminal and a fourth terminal, wherein the first terminal is coupled to the anode of the rectifier, the second and the third terminals are respectively coupled to the gate terminals of the first and second transistor, and the fourth terminal is coupled to the cathode of the rectifier.

26. The circuit as claimed in claim 25, wherein the voltage coupling circuit provides a first voltage signal to the gate of the first transistor and a second voltage signal to the gate of the second transistor to turn on the rectifier.

27. The circuit as claimed in claim 26, wherein the voltage coupling circuit includes a first capacitor coupled to the first terminal of the voltage coupling circuit and the gate terminal of the first transistor, and a second capacitor coupled to the first terminal of the voltage coupling circuit and the gate terminal of the second transistor.

28. The circuit as claimed in claim 27, wherein the voltage coupling circuit further includes a third transistor having a source, a drain and a gate, the drain being coupled to the gate and the source being coupled to the gate of the first transistor.

29. The circuit as claimed in claim 27, wherein the voltage coupling circuit further includes a clamping circuit, a first resistor and a second resistor, the clamping circuit coupled to the first resistor and the gate terminal of the first transistor, and the first resistor coupled to the clamping circuit and the cathode of the rectifier, and the second resistor coupled to the gate terminal of the second transistor and the cathode of the rectifier.

30. The circuit as claimed in claim 29, wherein the clamping circuit clamps the first voltage signal provided to the gate terminal of the first transistor, and the first and second resistors and the first and second capacitors control a time delay to turn on the rectifier.

31. The circuit as claimed in claim 29, wherein the clamping circuit comprises a transistor.

32. The circuit as claimed in claim 25, wherein the second p-type portion of the rectifier comprises a p-type semiconductor substrate.

33. The circuit as claimed in claim 25, wherein the first n-type portion of the rectifier comprises an n-well in a semiconductor substrate.

34. The circuit as claimed in claim 32, wherein the first n-type portion of the rectifier comprises an n-well in the semiconductor substrate, and the first p-type portion of the rectifier comprises a p-type diffused region inside the n-well.

35. The circuit as claimed in claim 34, wherein the second n-type portion of the rectifier comprises an n-type diffused region inside the semiconductor substrate and spaced apart from the first n-type portion.

36. The circuit as claimed in claim 29, wherein the voltage coupling circuit further includes a fourth transistor having a source, a drain and a gate, the drain coupled to the gate of the second transistor, the gate coupled to the drain of the third transistor, and the source coupled to the cathode.

37. An integrated circuit, comprising:
- a signal pad for receiving and outputting a signal;
- an output buffer having a first terminal and a second terminal, wherein the second terminal is coupled to the signal pad;
- a rectifier with an anode and a cathode including a first p-type portion, a first n-type portion contiguous with the first p-type portion, a second p-type portion contiguous with the first n-type portion, and a second n-type portion contiguous with the second p-type portion, wherein the anode of the rectifier is coupled to the second terminal of the output buffer and the cathode of the rectifier is coupled to ground;
- a first transistor having a first terminal, a second terminal and a gate terminal, wherein the first terminal is coupled to the first n-type portion of the rectifier;
- a second transistor having a first terminal, a second terminal and a gate terminal, wherein the first terminal is coupled to the second terminal of the first transistor, and the second terminal is coupled to the second n-type portion of the rectifier; and
- a voltage coupling circuit having a first terminal, a second terminal, a third terminal and a fourth terminal, wherein the first terminal is coupled to the first terminal of the output buffer, the second and the third terminals are respectively coupled to the gate terminals of the first and second transistor, and the fourth terminal is coupled to the cathode of the rectifier.

38. The circuit as claimed in claim 37, wherein the voltage coupling circuit provides a first voltage signal to the gate of the first transistor and a second voltage signal to the gate of the second transistor to turn on the rectifier.

39. The circuit as claimed in claim 38, wherein the voltage coupling circuit includes a first capacitor coupled to the first terminal of the voltage coupling circuit and the gate terminal of the first transistor, and a second capacitor coupled to the first terminal of the voltage coupling circuit and the gate terminal of the second transistor.

40. The circuit as claimed in claim 39, wherein the voltage coupling circuit further includes a third transistor having a source, a drain and a gate, the drain coupled to the gate and the source coupled to the gate of the first transistor.

41. The circuit as claimed in claim 39, wherein the voltage coupling circuit further includes a clamping circuit, a first resistor and a second resistor, the clamping circuit coupled to the first resistor and the gate terminal of the first transistor, and the first resistor couple to the clamping circuit and the cathode of the rectifier, and the second resistor coupled to the gate terminal of the second transistor and the cathode of the rectifier.

42. The circuit as claimed in claim 41, wherein the clamping circuit clamps the first voltage signal provided to the gate terminal of the first transistor, and the first and second resistors and the first and second capacitors control a time delay to turn on the rectifier.

43. The circuit as claimed in claim 41, wherein the clamping circuit comprises a transistor.

44. The circuit as claimed in claim 37, wherein the second p-type portion of the rectifier comprises a p-type semiconductor substrate.

45. The circuit as claimed in claim 37, wherein the first n-type portion of the rectifier comprises an n-well in a semiconductor substrate.

46. The circuit as claimed in claim 44, wherein the first n-type portion of the rectifier comprises an n-well in the semiconductor substrate, and the first p-type portion of the rectifier comprises a p-type diffused region inside the n-well.

47. The circuit as claimed in claim 46, wherein the second n-type portion of the rectifier comprises an n-type diffused region inside the semiconductor substrate and spaced apart from the first n-type portion.

48. The circuit as claimed in claim 41, wherein the voltage coupling circuit further includes a fourth transistor having a source, a drain and a gate, the drain coupled to the gate of the second transistor, the gate coupled to the drain of the third transistor, and the source coupled to the cathode.

49. A method for protecting an integrated circuit with a dual input/output pad from electrostatic discharge, comprising:

provjding a rectifier having a first p-type portion, a first n-type portion contiguous with the first p-type portion, a second p-type portion contiguous with the first n-type portion, and a second n-type portion contiguous with the second p-type portion;

providing a first transistor having a first terminal, a second terminal and a gate terminal, wherein the first terminal is coupled to the first n-type portion of the rectifier;

providing a second transistor having a first terminal, a second terminal and a gate terminal, wherein the first terminal is coupled to the second terminal of the first transistor, and the second terminal is coupled to the second n-type portion of the rectifier; and providing a voltage coupling circuit coupled to the gate terminals of the first and second transistors.

50. The method as claimed in claim 49, further comprising a step of providing a first voltage signal to the gate of the first transistor and a second voltage signal to the gate of the second transistor to turn on the rectifier.

* * * * *

UNITED STATES PATENT AND TRADEMARK OFFICE
CERTIFICATE OF CORRECTION

PATENT NO. : 6,747,861 B2  
DATED : June 8, 2004  
INVENTOR(S) : Ming-Dou Ker et al.

It is certified that error appears in the above-identified patent and that said Letters Patent is hereby corrected as shown below:

<u>Title page,</u>  
Item [75], Inventors, "Hsinghuang" should read -- Hsinchu --. also "Chung" should read -- Chuang, --.

<u>Column 10,</u>  
Line 15, "n-type portion, a" should read -- p-type portion, a --.

Signed and Sealed this

Fourteenth Day of December, 2004

JON W. DUDAS  
*Director of the United States Patent and Trademark Office*